(12) United States Patent
Shum et al.

(10) Patent No.: US 7,935,979 B2
(45) Date of Patent: May 3, 2011

(54) WIRE BONDING TO CONNECT ELECTRODES

(75) Inventors: Frank Shum, Sunnyvale, CA (US); William So, Sunnyvale, CA (US)

(73) Assignee: Bridgelux, Inc., Livermore, CA (US)

( * ) Notice: Subject to any disclaimer, the term of this patent is extended or adjusted under 35 U.S.C. 154(b) by 25 days.

(21) Appl. No.: 12/234,601

(22) Filed: Sep. 19, 2008

(65) Prior Publication Data

US 2009/0273001 A1 Nov. 5, 2009

Related U.S. Application Data

(60) Provisional application No. 61/049,619, filed on May 1, 2008.

(51) Int. Cl.
*H01L 33/00* (2010.01)

(52) U.S. Cl. ...... 257/99; 257/81; 257/91; 257/E33.065; 257/E21.509; 438/22; 438/26; 438/617

(58) Field of Classification Search .................. 438/26; 257/99, 91, E33.065

See application file for complete search history.

(56) References Cited

U.S. PATENT DOCUMENTS

| | | | | |
|---|---|---|---|---|
| 4,558,345 | A * | 12/1985 | Dwyer et al. | 257/786 |
| 5,686,762 | A * | 11/1997 | Langley | 257/775 |
| 6,107,644 | A * | 8/2000 | Shakuda et al. | 257/79 |
| 6,307,218 | B1 * | 10/2001 | Steigerwald et al. | 257/99 |
| 6,444,295 | B1 * | 9/2002 | Peng et al. | 428/209 |
| 6,847,052 | B2 * | 1/2005 | Fan et al. | 257/79 |
| 7,187,179 | B1 * | 3/2007 | Scaman et al. | 324/512 |
| 2001/0013657 | A1 * | 8/2001 | Anand | 257/758 |
| 2003/0202552 | A1 * | 10/2003 | Ueki et al. | 372/46 |
| 2006/0255358 | A1 * | 11/2006 | Shum | 257/99 |
| 2008/0054290 | A1 * | 3/2008 | Shieh et al. | 257/99 |

* cited by examiner

*Primary Examiner* — Angel Roman
(74) *Attorney, Agent, or Firm* — Arent Fox LLP

(57) ABSTRACT

A light emitting apparatus includes a semiconductor layer having an electrode with two traces physically separated from one another. The light emitting apparatus further includes a wire bond electrically connecting the two traces.

16 Claims, 4 Drawing Sheets

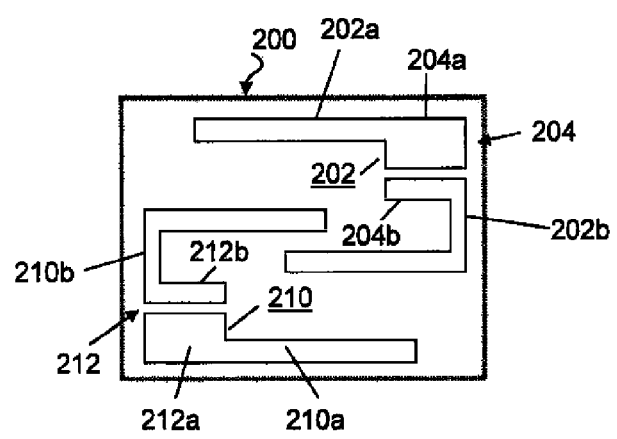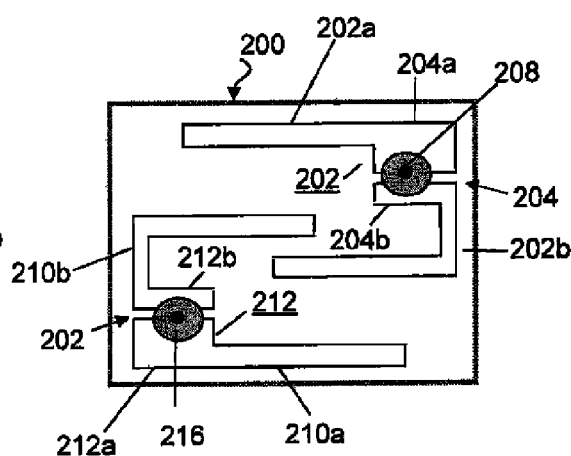
FIG. 2A   FIG. 2B

US 7,935,979 B2

WIRE BONDING TO CONNECT ELECTRODES

CROSS REFERENCE TO RELATED APPLICATION

This Application claims priority from U.S. Provisional Application Ser. No. 61/049,619, filed May 1, 2008. The entirety of the provisional application is incorporated herein by reference.

BACKGROUND

1. Field

The present disclosure relates to light emitting devices, and more particularly to electrodes for light emitting diodes.

2. Background

A light emitting diode (LED) is a semiconductor material impregnated, or doped, with impurities. These impurities add "electrons" and "holes" to the semiconductor, which can move in the material relatively freely. Depending on the kind of impurity, a doped region of the semiconductor can have predominantly electrons or holes, and is referred respectively as n-type or p-type semiconductor regions, respectively. In LED applications, the semiconductor includes an n-type semiconductor region, a p-type semiconductor region, and an active region between the n-type semiconductor region and the p-type semiconductor region. When a forward voltage is applied across the p-n junction, electrons and holes are forced into the active region and combine. When electrons combine with holes, they fall to lower energy levels and release energy in the form of light.

During operation, a forward voltage is applied across the p-n junction through a pair of electrodes. The electrodes are formed on the semiconductor material with a p-electrode formed on the p-type semiconductor region and an n-electrode formed on the n-type semiconductor region. Each electrode includes a wire bond pad that allows an external voltage to be applied to the LED.

Generally, when an external voltage source is applied to the LED, the current does not spread uniformly within the semiconductor regions resulting in a phenomenon known as "current crowding." Current crowding is the non-homogenous distribution of current density through a conductor or semiconductor, especially in the vicinity of the wire bond pads and across the p-n junction.

Current crowding leads to a reduction in the optical and electrical performance of the LED, particularly for conditions of high average current density and for LEDs that are made with larger diameters. Current crowding can also lead to localized overheating and result in the formation of thermal hot spots. Accordingly, there is a need in the art for improvements in LEDs to reduce current crowding by providing a more uniform distribution of current through the semiconductor material when a forward bias is applied across the p-n junction.

SUMMARY

In one aspect of the disclosure, a light emitting apparatus includes a semiconductor layer having an electrode with two traces physically separated from one another, and a wire bond electrically connecting the two traces.

In another aspect of the disclosure, a method of connecting a wire bond to an electrode includes forming an electrode on a semiconductor layer, the electrode being formed with two traces physically separated from one another, and electrically connecting the two traces with a wire bond.

It is understood that other aspects of the present invention will become readily apparent to those skilled in the art from the following detailed description, wherein it is shown and described only exemplary configurations of an LED by way of illustration. As will be realized, the present invention includes other and different aspects and its several details are capable of modification in various other respects, all without departing from the spirit and scope of the present invention. Accordingly, the drawings and the detailed description are to be regarded as illustrative in nature and not as restrictive.

BRIEF DESCRIPTION OF THE FIGURES

Various aspects of the present invention are illustrated by way of example, and not by way of limitation, in the accompanying drawings, wherein:

FIG. 2A is a conceptual top view of a lateral LED with current spreading electrodes;

FIG. 2B is a conceptual top view of the LED of FIG. 2A showing further details;

DETAILED DESCRIPTION

Figure 1A:
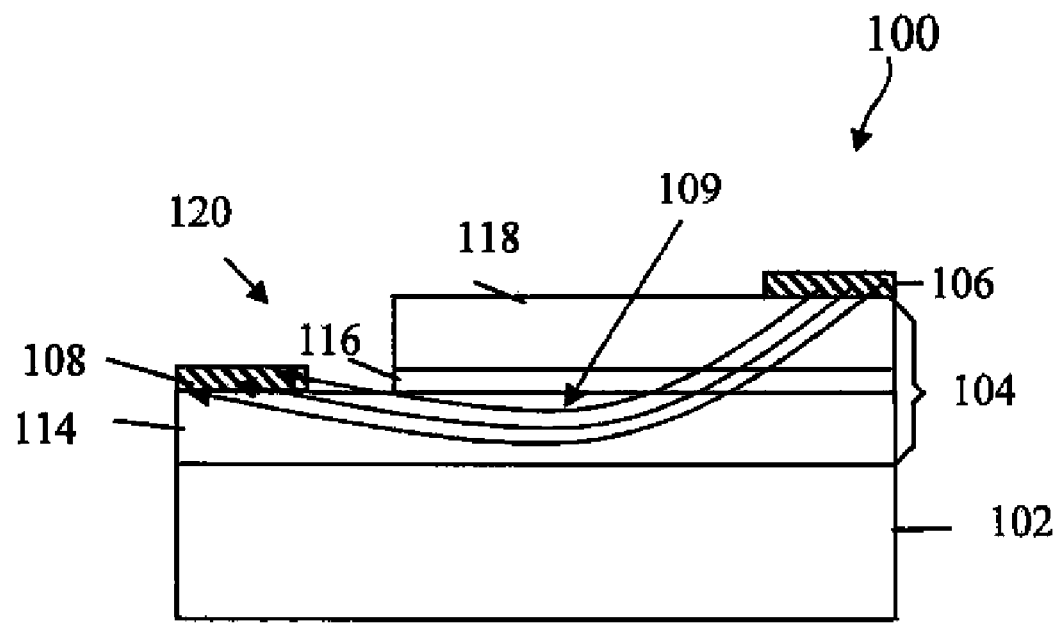
FIG. 1A is a conceptual cross-sectional view illustrating an example of an LED with a lateral structure.

The present invention is described more fully hereinafter with reference to the accompanying drawings, in which various aspects of the present invention are shown. This invention may, however, be embodied in many different forms and should not be construed as limited to the various aspects of the present invention presented throughout this disclosure. Rather, these aspects are provided so that this disclosure will be thorough and complete, and will fully convey the scope of the present invention to those skilled in the art. The various aspects of the present invention illustrated in the drawings may not be drawn to scale. Accordingly, the dimensions of the various features may be expanded or reduced for clarity. In addition, some of the drawings may be simplified for clarity. Thus, the drawings may not depict all of the components of a given apparatus (e.g., device) or method.

Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present invention.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element it can be grown, deposited, etched, attached, connected, coupled, or otherwise prepared or fabricated on the other element or an intervening element.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" sides of the other elements. The term "lower", can therefore, encompass both an orientation of "lower" and "upper," depending of the particular orientation of the apparatus. Similarly, if an apparatus in the drawing is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items It will be understood that although the terms "first" and "second" may be used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Figure 1B:
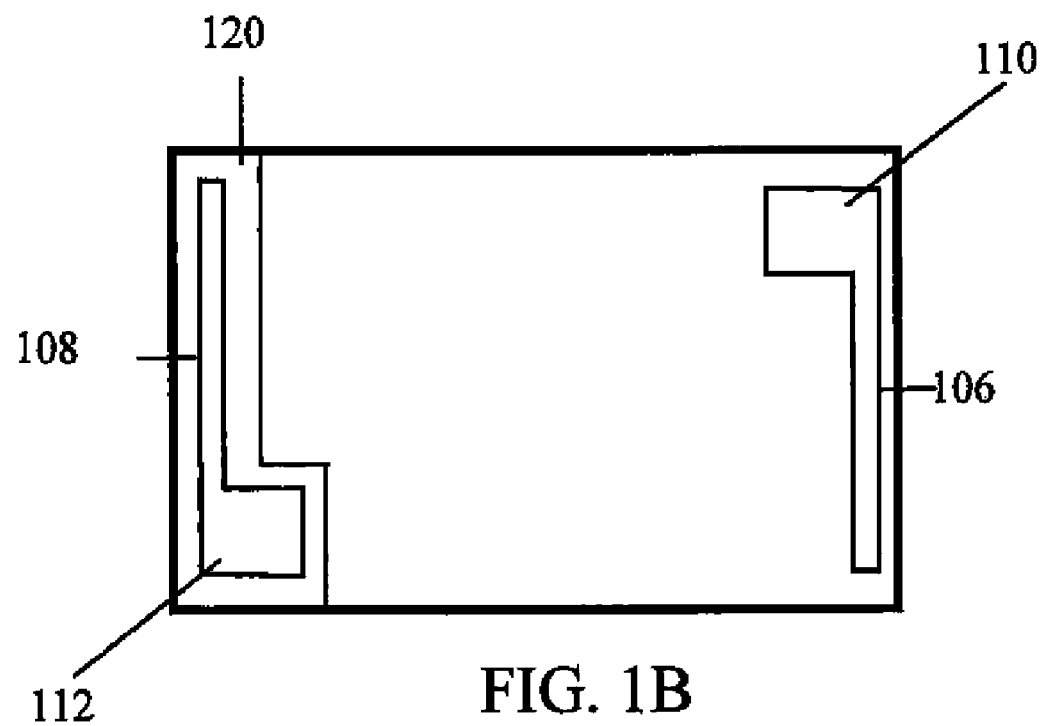
FIG. 1B is a conceptual top view of the LED of FIG. 1A.

Turning to FIGS. 1A and 1B, an LED with a lateral structure is shown. However, as those skilled in the art will readily appreciate, the various aspects of the present invention disclosed herein are likewise applicable to other LED structures, including by way of example, LEDs with flip-chip structures, as well as other structures now known or later discovered. Accordingly, any reference to a lateral structure LED is intended to illustrate various aspects of the present invention, with the understanding that such aspects may be extended to a wide range of applications.

FIG. 1A is a conceptual cross-sectional view illustrating an example of an LED with a lateral structure and FIG. 1B is a conceptual top view of the LED of FIG. 1A. In this example, the LED 100 includes a substrate 102, an epitaxial-layer structure 104 on the substrate 102, and a pair of electrodes 106 and 108 on the epitaxial-layer structure 104. Each electrode 106 and 108 includes a wire bond pad 110 and 112, respectively.

The epitaxial-layer structure 104 comprises an active layer 116 sandwiched between two oppositely doped epitaxial layers. In this example, an n-type semiconductor layer 114 is formed on the substrate 102 and a p-type semiconductor layer 118 is formed on the active layer 116, however, the layers may be reversed. That is, the p-type semiconductor layer 118 may be formed on the substrate 102 and the n-type semiconductor layer 114 may formed on the active layer 116. As those skilled in the art will readily appreciate, the various concepts described throughout this disclosure may be extended to any suitable epitaxial-layer structure. Additional layers (not shown) may also be included in the epitaxial-layer structure 104, including but not limited to buffer, nucleation, contact and current spreading layers as well as light extraction layers.

The epitaxial-layer structure 104 may be fabricated using known processes such as, by way of example, metal organic chemical vapor deposition (MOCVD) or other suitable processes. The layers of the epitaxial-layer structure 104 may be formed on a growth substrate (not shown). The growth substrate can remain as part of the LED or the growth substrate can be removed and the epitaxial-layer structure 104 mounted on a substitute carrier substrate 102 as shown in FIG. 1A.

The electrodes 106 and 108, which may be formed on the surface of the epitaxial-layer structure 104 using known methods, provide a means to apply a voltage to the LED. When a voltage is applied, current flows from the p-type electrode 106 to the n-electrode 108 as shown by reference designation 109.

The p-type semiconductor layer 118 is exposed at the top surface, and therefore, the p-type electrode 106 may be readily formed thereon. However, the n-type semiconductor layer 114 is buried beneath the p-type semiconductor layer 118 and the active layer 116. Accordingly, to form the n-type electrode 108 on the n-type semiconductor layer 114, a cutout area 120 or "mesa" is formed by removing a portion of the active layer 116 and the p-type semiconductor layer 118 by means well known in the art to expose the n-type semiconductor layer 114 there beneath. After this portion of the epitaxial-layer structure 104 is removed, the n-type electrode 108 may be formed.

FIG. 2A is a conceptual top view of a lateral LED with a current spreading electrode structure and FIG. 2B is a conceptual top view of the LED of FIG. 2A with a wire bond soldered bonded, or otherwise connected to each wire bond pad. In this example, p-type and n-type electrodes 202 and 210 are formed to provide a more uniform current density distribution across the p-n junction of the LED.

In this example, the p-type electrode 202 includes two separate traces 202a and 202b. The first trace 202a extends along an edge of the LED 200 and terminates in an electrode segment 204a that forms part of the wire bond pad 204 for the p-type electrode 202. The second trace 202b has a substantially L-shaped pattern (as shown in FIG. 2A) that also terminates in an electrode segment 204b that, together with the electrode segment 204a of the first electrode 202, forms the wire bond pad 204. In this configuration, a small gap exists between the electrode segments 204a and 204b that form the wire bond pad 204, which may be bridged by a wire bond 208 as shown in FIG. 2B.

The n-type electrode 210 includes two traces 210a and 210b which has a substantially complimentary configuration. The first trace 210a extends along an opposite edge of the LED 200 and terminates in an electrode segment 212a that forms part of the wire bond pad 212 for the n-type electrode 210. The second trace 210b has a substantially L-shaped pattern (as shown in FIG. 2A) that also terminates in an electrode segment 212b that, together with the electrode segment 212a of the first electrode 210, forms the wire bond pad 212. A small gap exists between the electrode segments 212a and 212b that form the wire bond pad 212, which may be bridged by a wire bond 216 as shown in FIG. 2B.

Figure 3:
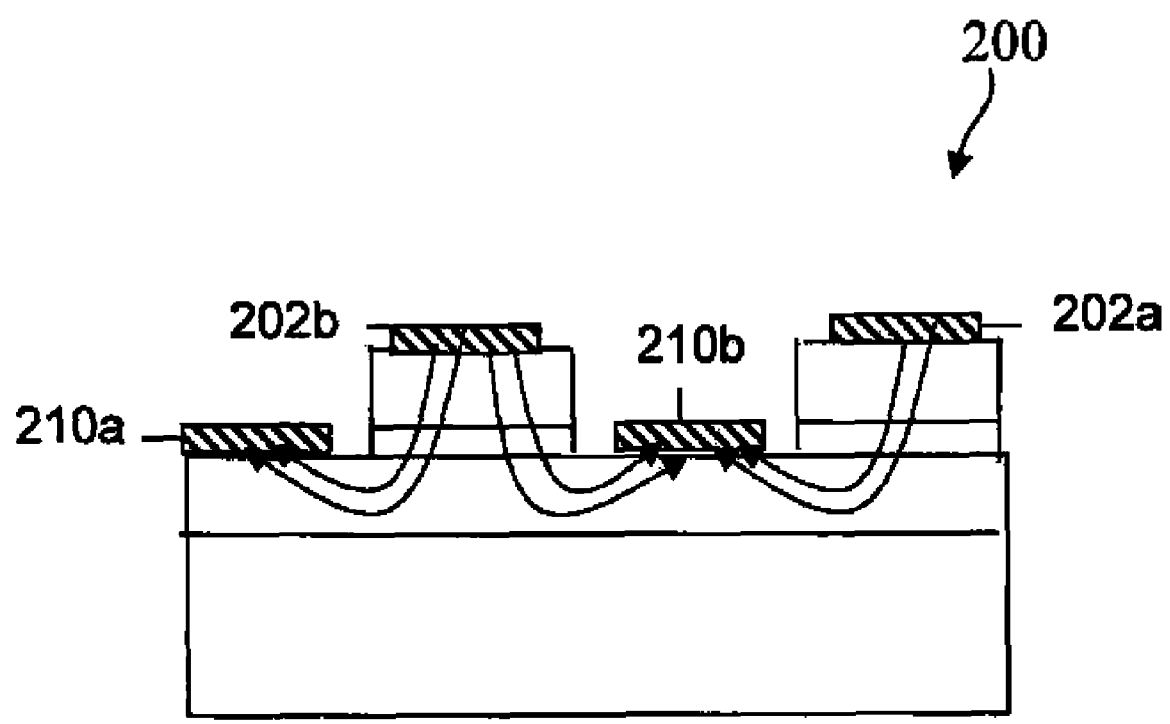
FIG. 3 is a conceptual cross-sectional view of the LED of FIGS. 2A and 2B.

FIG. 3 is a conceptual cross-sectional view of the LED shown in FIG. 2A. As one can readily observe from the arrows, the second trace 202b of the p-type electrode and the second trace 210b of the n-type electrode each provide two separate current paths. In addition, the current paths between the p-type and n-type electrodes are shorter than might otherwise be the case with the electrode structure shown in FIGS 1A. As a result, the current density distribution tends to be more uniform, thereby reducing the tendency for current crowding.

Figure 4:
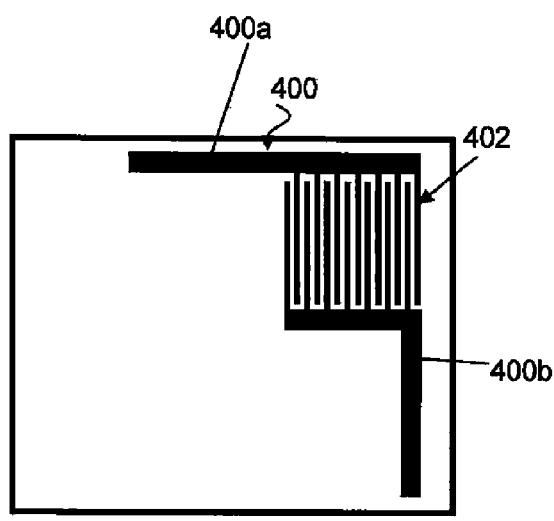
FIG. 4 is a conceptual top view of a lateral LED illustrating another example of a current spreading electrode.

In some LED configurations, it may be desirable to increase the width of the gap beneath the wire bond to ensure electrical connectivity between the traces. An example of this configuration will now be presented with reference to FIG. 4. FIG. 4 is a conceptual top view of a lateral LED illustrating an electrode. For purposes of brevity, a single electrode 400 is shown with the understanding that a complimentary electrode (not shown) will also be formed on the LED. The electrode 400 in combination with a complimentary electrode (not shown) may provide good current density distribution across the p-n junction of the LED. The electrode 400 may be a p-type electrode or an n-type electrode. The following example will be presented without regard to its polarity.

The electrode 400 includes two separate traces 400a and 400b. The first trace 400a extends horizontally along the edge of the LED and terminates in an electrode segment having a number of vertically extending fingers. The second trace 400b includes a first portion that extends vertically along an adjacent edge of the LED and a second portion that extends horizontally toward the center of the LED. The second portion of the trace 400b includes a number of vertically extending fingers that alternate or "interdigitate" with the fingers extending from the first trace 400b to form a wire bond pad 402. A wire bond (not shown) may be formed on the interdigitated fingers to electrically connect the two traces 400a and 400b of the electrode 400.

Figure 5:
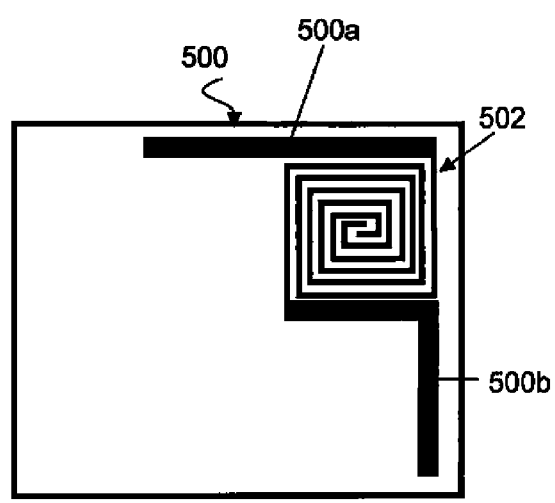
FIG. 5 is a conceptual top view of a lateral LED illustrating yet another example of a current spreading electrode.

FIG. 5 is a conceptual top view of a lateral LED illustrating another example of an electrode with a wide gap between the traces. Like the example presented earlier in connection with FIG. 4, the LED is shown with a single electrode 500 with the understanding that a complimentary electrode (not shown) will also be formed on the LED. The electrode 500, which may be a p-type or n-type electrode, may provide good current density distribution across the p-n junction of the LED when used in combination with a complimentary electrode (not shown). The following example will be presented without regard for the electrode's polarity.

The electrode 500 includes two separate traces 500a and 500b. The first trace 500a extends horizontally along the edge of the LED and terminates in an electrode segment having a spiral pattern. The second trace 500b includes a first portion that extends vertically along an adjacent edge of the LED and a second portion that extends horizontally toward the center of the LED. The second portion of the trace 500b includes a spiral pattern that is interleaved with the spiral pattern of the first trace 500a to form a wire bond pad 502 as shown in FIG. 5. A wire bond (not shown) may be formed on the interleaved spiral patterns to electrically connect the two traces 500a and 500b of the electrode 502.

The various aspects of this disclosure are provided to enable one of ordinary skill in the art to practice the present invention. Various modifications to aspects presented throughout this disclosure will be readily apparent to those skilled in the art, and the concepts disclosed herein may be extended to other applications. By way of example, an electrode formed by two traces having a wide gap as described in connection with FIGS. 4 and 5 are not limited to a wire bond pad having interdigitated fingers or interleaved spiral patterns. Other electrode patterns may be used to bridge the gap between the two traces and those skilled in the art will be able to determine the appropriate electrode pattern for any particular application. Thus, the claims are not intended to be limited to the various aspects of this disclosure, but are to be accorded the full scope consistent with the language of the claims. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A light emitting apparatus, comprising:
a first semiconductor layer having a first electrode and a second semiconductor layer having a second electrode, wherein each electrode has two traces physically separated from one another by a gap; and
at least one wire bond electrically connecting the two traces of at least one of the respective first and second electrodes through one end of the wire bond by bridging the gap.

2. The light emitting apparatus of claim 1 wherein each of the two traces form a connecting pad, and wherein the wire bond is connected to the connecting pad to electrically connect the two traces.

3. The light emitting apparatus of claim 2 wherein the connecting pad is formed with the gap between the two traces, and wherein the wire bond extends across the gap.

4. The light emitting apparatus of claim 2 wherein a first one of the two traces terminates in a first plurality of fingers and a second one of the two traces terminates in a second plurality of fingers, wherein the connecting pad comprises the first and second plurality of fingers.

5. The light emitting apparatus of claim 4 wherein the first plurality of fingers is indigitated with the second plurality of fingers.

6. The light emitting apparatus of claim 2 wherein a first one of the two traces terminates in a first spiral pattern and a second one of the two traces terminates in a second spiral pattern, wherein the connecting pad comprises the first and second spiral patterns.

7. The light emitting apparatus of claim 6 wherein the first spiral pattern is interleaved with the second spiral pattern.

8. The light emitting apparatus of claim 1 further comprising a an active region between the first and second semiconductor layers.

9. A method of connecting a wire bond to an electrode, comprising:
   forming a first electrode on a first semiconductor layer and a second electrode on a second semiconductor layer, each electrode being formed with two traces physically separated from one another by a gap; and
   electrically connecting the two traces of at least one of the respective first and second electrodes with one end of a wire bond by bridging the gap.

10. The method of claim 9 wherein the two traces are formed with a connecting pad, and wherein the two traces are electrically connected by connecting the wire bond to the connecting pad.

11. The method of claim 10 wherein the connecting pad is formed with the gap between the two traces, and wherein the two traces are electrically connected by connecting the wire bond across the gap.

12. The method of claim 10 wherein the two traces are formed by terminating a first one of the two traces in a first plurality of fingers and terminating a second one of the two traces terminates in a second plurality of fingers, wherein the connecting pad comprises the first and second plurality of fingers.

13. The method of claim 12 wherein the two traces are formed by interleaving the first plurality of fingers with the second plurality of fingers.

14. The method of claim 10 wherein the two traces are formed by terminating a first one of the two traces in a first spiral pattern and terminating a second one of the two traces terminates in a second spiral pattern, wherein the connecting pad comprises the first and second spiral patterns.

15. The method of claim 14 wherein the two traces are formed by interleaving the first spiral pattern with the second spiral pattern.

16. The method of claim 9 further comprising forming an active region between the first and second semiconductor layers.

* * * * *